US009209182B2

(12) United States Patent
Chern et al.

(10) Patent No.: US 9,209,182 B2
(45) Date of Patent: Dec. 8, 2015

(54) DUMMY METAL GATE STRUCTURES TO REDUCE DISHING DURING CHEMICAL-MECHANICAL POLISHING

(71) Applicant: Taiwan Semiconductor Manufacturing Company, Ltd., Hsin-Chu (TW)

(72) Inventors: Chan-Hong Chern, Palo Alto, CA (US); Chih-Chang Lin, San Jose, CA (US); Jacklyn Chang, San Ramon, CA (US); Julie Tran, San Jose, CA (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/936,909

(22) Filed: Jul. 8, 2013

(65) Prior Publication Data

US 2014/0183652 A1   Jul. 3, 2014

Related U.S. Application Data

(60) Provisional application No. 61/747,168, filed on Dec. 28, 2012.

(51) Int. Cl.
*H01L 27/092* (2006.01)
*H01L 27/02* (2006.01)
*H01L 21/321* (2006.01)
*H01L 21/8238* (2006.01)

(52) U.S. Cl.
CPC .......... *H01L 27/092* (2013.01); *H01L 21/3212* (2013.01); *H01L 27/0207* (2013.01); *H01L 21/82385* (2013.01)

(58) Field of Classification Search
CPC ............... H01L 21/823807; H01L 21/823842; H01L 29/66545; H01L 29/6681; H01L 27/092
USPC ......................................................... 257/369
See application file for complete search history.

(56) References Cited

U.S. PATENT DOCUMENTS

| 6,323,113 | B1* | 11/2001 | Gabriel et al. ................ 438/584 |
|---|---|---|---|
| 6,812,506 | B1* | 11/2004 | Nariman et al. .............. 257/204 |
| 2005/0280031 | A1* | 12/2005 | Yano .............................. 257/202 |
| 2008/0265335 | A1* | 10/2008 | Ryu et al. ...................... 257/390 |
| 2009/0259902 | A1* | 10/2009 | Tahata .......................... 714/728 |
| 2010/0052060 | A1* | 3/2010 | Lai et al. ....................... 257/368 |
| 2010/0193870 | A1* | 8/2010 | Ho et al. ........................ 257/365 |
| 2011/0147765 | A1* | 6/2011 | Huang et al. .................... 257/77 |
| 2011/0221009 | A1* | 9/2011 | Chuang et al. ................ 257/392 |
| 2011/0227188 | A1* | 9/2011 | Wang et al. ................... 257/499 |
| 2012/0104509 | A1* | 5/2012 | Matsumoto ................... 257/369 |
| 2012/0178269 | A1* | 7/2012 | Ohno ............................. 438/799 |
| 2013/0009250 | A1* | 1/2013 | Lee et al. ...................... 257/369 |
| 2013/0015524 | A1* | 1/2013 | Hsu et al. ...................... 257/344 |
| 2013/0249010 | A1 | 9/2013 | Ng et al. |

* cited by examiner

*Primary Examiner* — Christine Enad
(74) *Attorney, Agent, or Firm* — Slater & Matsil, L.L.P.

(57) ABSTRACT

The described embodiments of mechanisms for placing dummy gate structures next to and/or near a number of wide gate structures reduce dishing effect for gate structures during chemical-mechanical polishing of gate layers. The arrangements of dummy gate structures and the ranges of metal pattern density have been described. Wide gate structures, such as analog devices, can greatly benefit from the reduction of dishing effect.

20 Claims, 9 Drawing Sheets

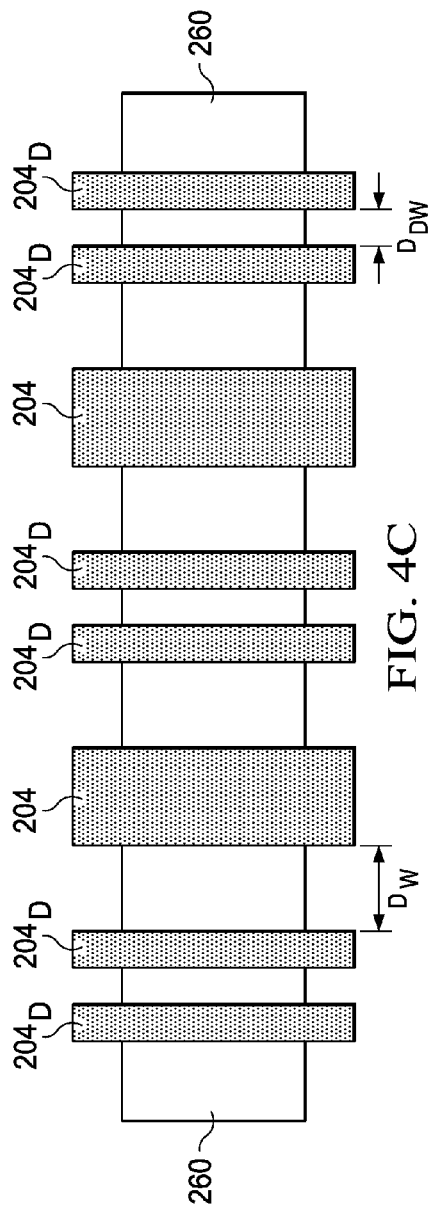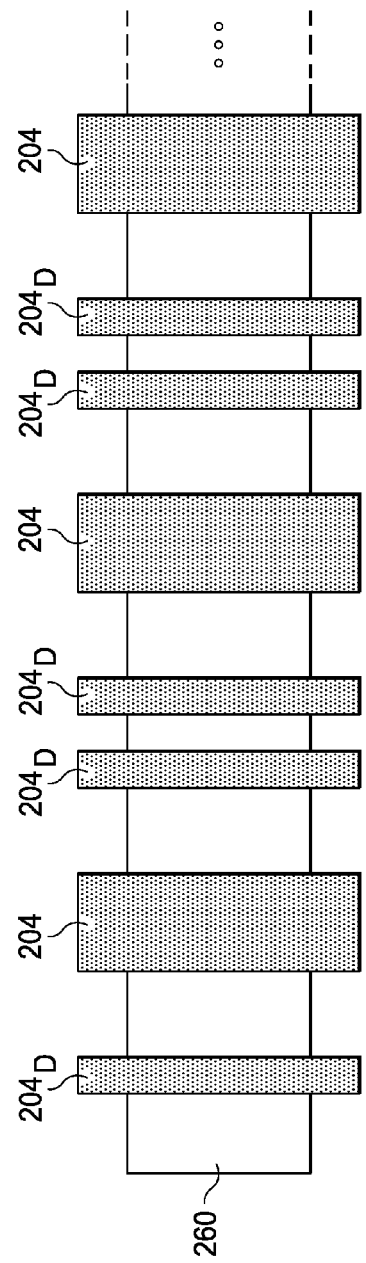

DUMMY METAL GATE STRUCTURES TO REDUCE DISHING DURING CHEMICAL-MECHANICAL POLISHING

This application claims priority to U.S. Provisional Application Ser. No. 61/747,168, filed on Dec. 28, 2012, entitled "Dummy Metal Gate Structures to Reduce Dishing During Chemical-Mechanical Polishing," which application is hereby incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed.

One advancement implemented as technology nodes shrink, in some IC designs, has been the replacement of the typically polysilicon gate electrode with a metal gate electrode to improve device performance with the decreased feature sizes. One process of forming a metal gate stack is termed a replacement or "gate last" process in which the final gate stack is fabricated "last" which allows for reduced number of subsequent processes, including high temperature processing, that must be performed after formation of the gate. There are challenges to implementing such features and processes in CMOS fabrication however. These challenges increase for devices having different types of gate structures on a single substrate.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 4A-4E show a top view of a number of gate stacks and dummy gate stacks, in accordance with various embodiments.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. Further, to the extent that the present disclosure provides examples of planar transistors, one of ordinary skill in the art would recognize its applicability to multi-gate devices such as fin field-effect transistor (or finFET) devices.

Figure 1:
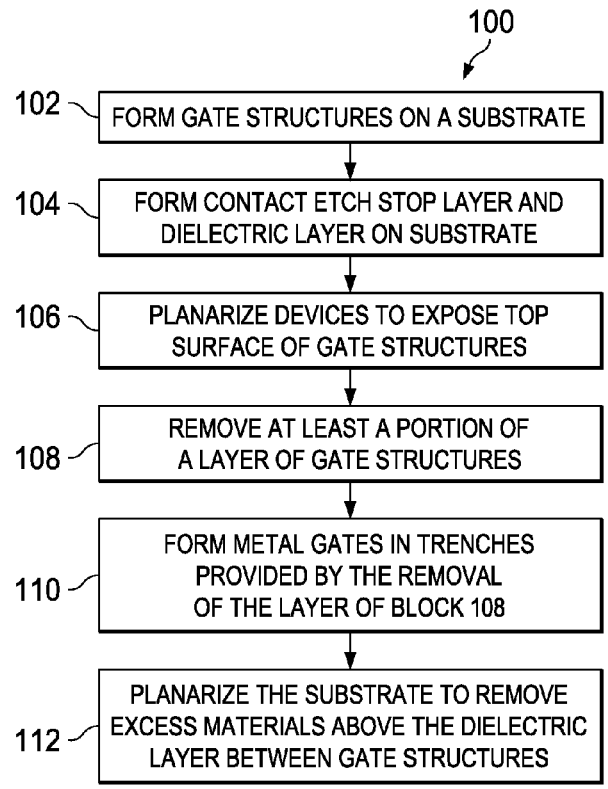
FIG. 1 is a flow chart illustrating an embodiment of a method of fabricating a semiconductor device, in accordance with some embodiments.

Illustrated in FIG. 1 is a flow chart of a method 100 of fabricating a semiconductor device, in accordance with some embodiments. The method 100 may be used to implement a replacement gate methodology on a hybrid semiconductor device. A hybrid semiconductor device includes a plurality of differently configured devices having differently configured gate structures (e.g., gate stacks having different layer compositions, thicknesses, etc). FIGS. 2A-2F are cross-sectional views of a device 200 fabricated according to the method 100 of FIG. 1, in accordance with some embodiments.

It is understood that the method 100 includes steps having features of a complementary metal-oxide-semiconductor (CMOS) technology process flow and thus, are only described briefly herein. Additional steps may be performed before, after, and/or during the method 100. Similarly, one may recognize other portions of a device that may benefit from the doping methods described herein.

It is also understood that parts of the semiconductor device 200 may be fabricated by complementary metal-oxide-semiconductor (CMOS) technology process flow, and thus some processes are only briefly described herein. Further, the semiconductor device 200 may include various other devices and features, such as additional transistors, bipolar junction transistors, resistors, capacitors, diodes, fuses, etc., but is simplified for a better understanding of the inventive concepts of the present disclosure. The semiconductor device 200 includes a plurality of semiconductor devices (e.g., transistors), which may be interconnected.

The device 200 may be an intermediate device fabricated during processing of an integrated circuit, or portion thereof, that may comprise static random access memory (SRAM) and/or other logic circuits, passive components such as resistors, capacitors, and inductors, and active components such as P-channel field effect transistors (PFETs), N-channel FETs (NFETs), metal-oxide semiconductor field effect transistors (MOSFETs), complementary metal-oxide semiconductor (CMOS) transistors, bipolar transistors, high voltage transistors, high frequency transistors, other memory cells, and combinations thereof.

The method 100 begins at block (or operation) 102 where a plurality of gate structures is formed on a semiconductor substrate. The plurality of gate structures may include a dielectric layer, a metal gate layer (e.g., work function material), and a dummy layer. In an embodiment, the dummy layer is polysilicon, however, other compositions may be possible. The dummy layer may be a sacrificial layer for at least one of the transistors to be formed on the substrate. The dummy layer may be the resulting gate electrode for at least one of the transistors to be formed on the substrate. The gate structures may be formed in different regions of the substrate, for example, regions defined for NFET devices, regions defined for PFET devices, regions defined for high-resistance transistors, regions defined for non-functional transistors (also known as dummy transistors), and/or other suitable regions defined by a design for an integrated circuit.

Figure 2A:
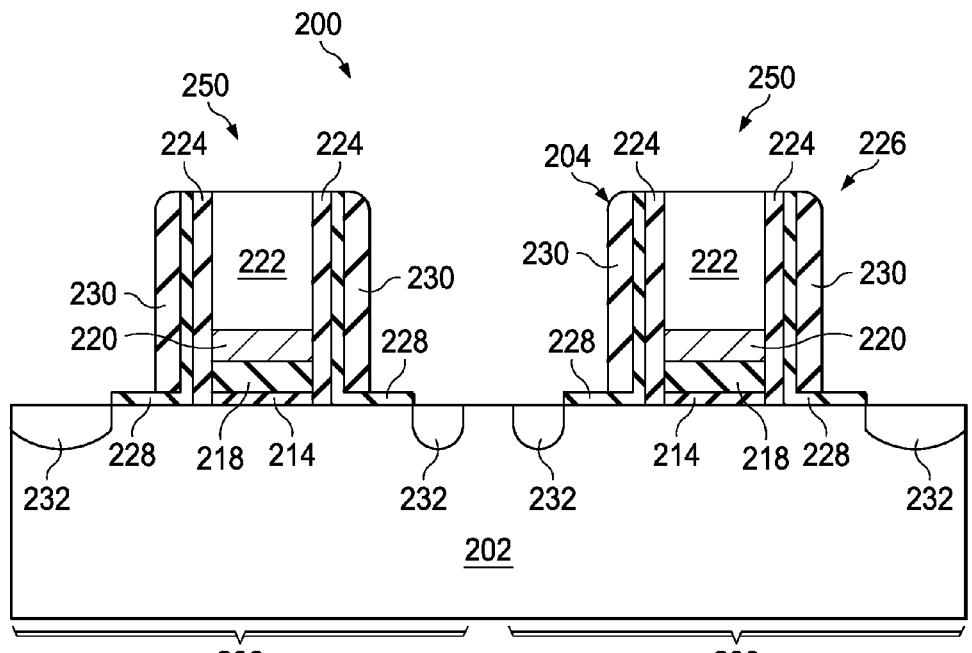
FIGS. 2A-2F show cross-sectional views of a sequential process of forming gate structures, in accordance with some embodiments.

FIGS. 2A-2F show cross-sectional views of a sequential process of forming gate structures, in accordance with some embodiments. Referring to FIG. 2A, a semiconductor device 200 having a substrate 202 and a plurality of gate structures 250 disposed thereon is illustrated, in accordance with some embodiments. The substrate 202 may be a silicon substrate. Alternatively, the substrate 202 may comprise another elementary semiconductor, such as germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the substrate 202 is a semiconductor on insulator (SOI).

The substrate 202 includes a first region 206 and a second region 208. In an embodiment, the first region 206 is an n-type field effect transistor region. In an embodiment, the second region 208 is a p-type field effect transistor region. It is noted that these regions are exemplary only and not intended to be limiting in type, configuration, arrangement, or the like.

The gate structures 250 includes gate stacks 204, which further include an interfacial layer 214, a gate dielectric layer 218, and a metal gate layer 220. A dummy layer 222 (e.g., polysilicon) is disposed on the metal gate layer 220. In some embodiments, the gate structures 204 may further include a capping layer, for example, interposing the gate dielectric layer 218 and the metal gate layer 220.

The interfacial layer 214 may include a dielectric material such as silicon oxide layer ($SiO_2$) or silicon oxynitride (SiON). The interfacial layer 214 may be formed by chemical oxidation, thermal oxidation, atomic layer deposition (ALD), CVD, and/or other suitable dielectric. The dielectric layer 218 may be a gate dielectric layer. The dielectric layer 218 may include a high-k dielectric layer such as hafnium oxide ($HfO_2$). Alternatively, the high-k dielectric layer may optionally include other high-k dielectrics, such as $TiO_2$, HfZrO, $Ta_2O_3$, $HfSiO_4$, $ZrO_2$, $ZrSiO_2$, combinations thereof, or other suitable material. The dielectric layer 218 may be formed by atomic layer deposition (ALD), CVD, and/or other suitable methods.

The metal gate layer 220 includes a work function metal. A work function value is associated with the material composition of the work function layer, and thus, the material of the first work function layer is chosen to tune its work function value so that a desired threshold voltage Vt is achieved in the device that is to be formed in the respective region. In an embodiment, the metal layer 220 is an n-type work function metal. Exemplary n-type work function metals that may be included in the gate stacks 204 include Ti, Ag, TaAl, TaAlC, TiAlN, TaC, TaCN, TaSiN, Mn, Zr, other suitable n-type work function materials, or combinations thereof. The metal gate layer 220 may be deposited by CVD, PVD, and/or other suitable processes. The polysilicon layer 222 may be formed by suitable deposition processes such as, for example, low-pressure chemical vapor deposition (LPCVD) and plasma-enhanced CVD (PECVD).

FIG. 2A shows that a seal layer 224 is formed next to the gate stacks 204, in accordance with some embodiments. In an embodiment, the seal layer 224 has a thickness of approximately 30 Angstroms (Å). Gate structures 250 also include spacer elements 226 formed abutting seal layer 224, as shown in FIG. 2A. However, if gate structures 250 do not include seal layer 224, spacer elements 226 would be formed next to the sidewalls of the gate stacks 204. The spacer elements 226 may be formed by depositing a dielectric material followed by an anisotropic etching process, however other embodiments are possible. In an embodiment, the spacer elements 226 include silicon oxide, silicon nitride, and/or other suitable dielectrics. The spacer elements 226 may include a plurality of layers. For example, in an embodiment, the spacer elements include approximately 30 Å of oxide and approximately 250 Å of silicon nitride. The spacer elements 226 may also be referred to as main spacers. The spacer elements 226 may include a liner layer 228 (e.g., oxide) having a uniform thickness and an overlying main spacer layer 230 (e.g., nitride), such as D-shaped spacers, as shown in FIG. 2A.

During the formation of the gate structures 250, source and drain regions are also formed. The source/drain regions may include the introduction of suitable dopant types: n-type or p-type dopants. The source/drain regions may include halo (or pocket) and/or low-dose drain (LDD) implantation, source/drain implantation, source/drain activation and/or other suitable processes. In other embodiments, the source/drain regions may include raised source/drain regions, strained regions, epitaxially grown regions, and/or other suitable techniques. In a further embodiment, the source/drain activation process may include a rapid thermal annealing, for example, at a temperature of approximately 1010 Celsius (° C.).

The exposed surfaces of source/drain regions formed as discussed above are silicided to form silicide regions 232, as shown in FIG. 2A. The silicide materials may include nickel silicide (NiSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), other suitable conductive materials, and/or combinations thereof. The silicide features can be formed by a process that includes depositing a metal layer, annealing the metal layer such that the metal layer is able to react with silicon to form silicide, and then removing the non-reacted metal layer. In an embodiment, nickel silicide is formed by depositing approximately 400 Å of nickel onto the substrate.

Figure 2B:
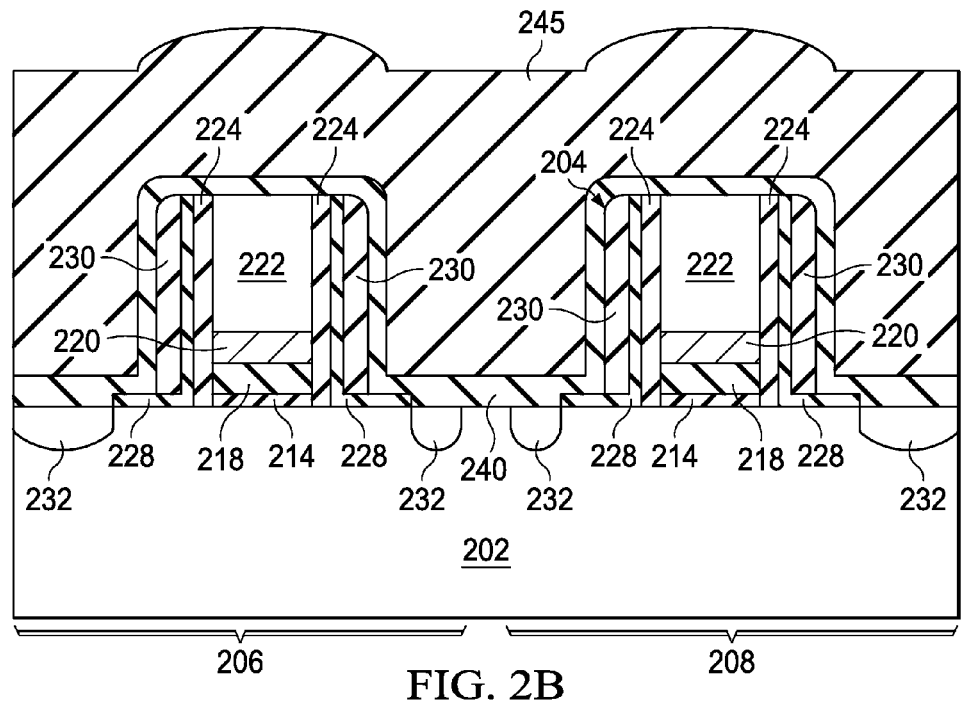
Figure 2C:
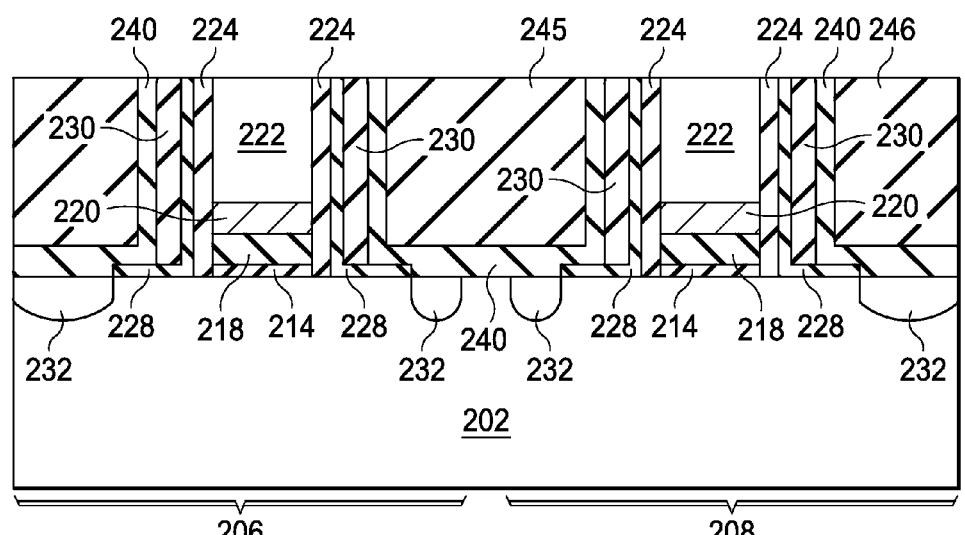

The method 100 then proceeds to block 104 where a contact etch stop layer (CESL) and/or intermediate dielectric layer are formed on the plurality of gate structures. Examples of materials that may be used to form CESL include silicon nitride, silicon oxide, silicon oxynitride, and/or other materials known in the art. The CESL may be formed by PECVD process and/or other suitable deposition or oxidation processes. The dielectric layer may include materials such as, tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The dielectric layer may be deposited by a PECVD process or other suitable deposition techniques. As shown in FIG. 2B, a CESL 240 and dielectric layer 245 are disposed over gate structures 250, in accordance with some embodiment.

The method 100 then proceeds to block 106 where a planarization process is performed to expose top surfaces of gate structures. The planarization process may include a chemical mechanical planarization (CMP). Referring to the example of FIG. 2C, a planarization process has been performed to form surface 246 and expose the polysilicon layer 222 of the gate stacks 204, which are part of gate structures 250.

Figure 2D:
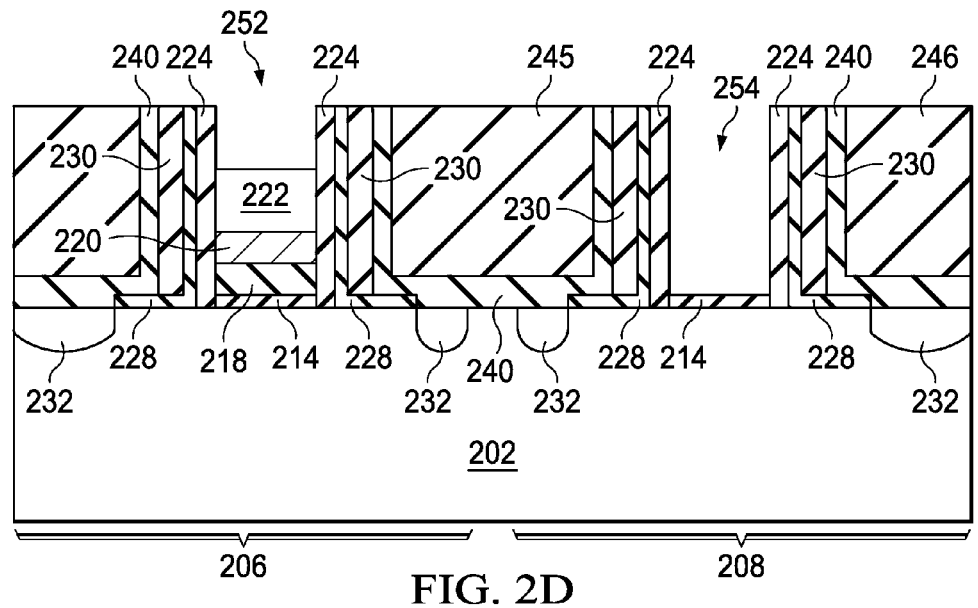

The method 100 then proceeds to block 108 where at least a portion of a layer of gate structures is removed. In an embodiment, at least a portion of the polysilicon layer 222 of the gate structures 250 in one or more regions of the substrate are removed. Referring to FIG. 2D, the remaining gate stack in the first region 206 of the substrate has a trench 252 formed from the partial removal of the polysilicon layer 222. The remaining gate stack in the second region 208 of the substrate has trench 254 formed from the removal of the polysilicon layer 222. It is noted that after and/or in situ with the removal of the entire polysilicon layer 222, the metal layer 220 and the dielectric layer 218 are exposed. The metal layer 220 and the dielectric layer 218 are also removed, in accordance with some embodiments. In some embodiments, the interfacial layer 214 remains in the trenches 254, however other embodiments are possible. Additional deposition, etching and lithographical process are involved in achieving the different removal of layers in gate stack 204 of region 206 and in gate stack 204 of region 208. Detailed information for these additional processes are described in U.S. patent application Ser. No. 13/424,935, titled "Metal Gate Semiconductor Device," and filed on Mar. 20, 2012, which is incorporate herein in its entirety.

The method 100 then proceeds to block 110 where metal gates are formed in trenches provided by removal of the layer in block 108 of the method 100. The metal gate formed may also include gate dielectric layer(s), capping layer(s), fill layer(s), and/or other suitable layers. A work function metal layer included in the metal gate may be an n-type or p-type work function layer. Exemplary p-type work function metals include TiN, TaN, Ru, Mo, Al, WN, $ZrSi_2$, $MoSi_2$, $TaSi_2$, $NiSi_2$, WN, other suitable p-type work function materials, or combinations thereof. Exemplary n-type work function metals include Ti, Ag, TaAl, TaAlC, TiAlN, TaC, TaCN, TaSiN, Mn, Zr, other suitable n-type work function materials, or combinations thereof. The work function layer may include a plurality of layers. The work function layer(s) may be deposited by CVD, PVD, and/or other suitable processes. In an embodiment, the metal gate formed is a p-type metal gate including a p-type work function layer.

A dielectric layer of the metal gate structure may include a high-k dielectric layer such as hafnium oxide ($HfO_2$). Alternatively, the high-k dielectric layer may optionally include other high-k dielectrics, such as $TiO_2$, HfZrO, $Ta_2O_3$, $HfSiO_4$, $ZrO_2$, $ZrSiO_2$, combinations thereof, or other suitable material. The dielectric layer may be formed by ALD and/or other suitable methods. The dielectric layer may be the same as or different composed than the dielectric layer 218 formed in the gate structure described above in block 102.

A fill layer of the metal gate structure may include Al, W, or Cu and/or other suitable materials. The fill metal may be formed by CVD, PVD, plating, and/or other suitable processes. The fill metal may be deposited over a work function metal layer(s), and thereby filling in the remaining portion of the trenches or openings.

Figure 2E:
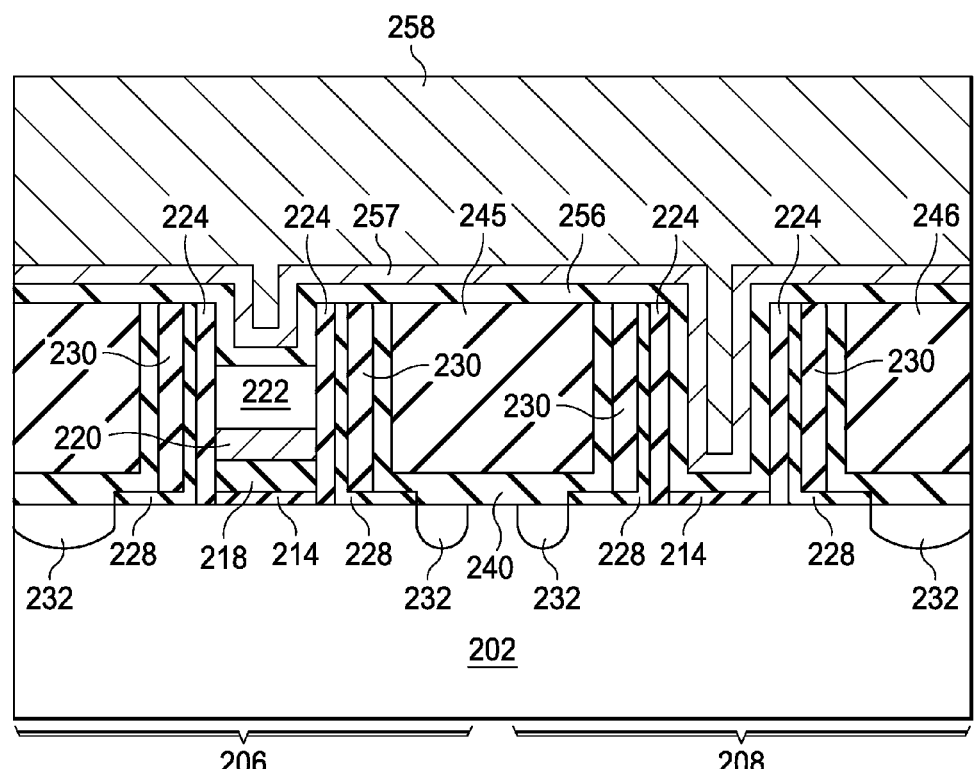

As shown in FIG. 2E, a gate dielectric layer 256 is formed on the substrate. The gate dielectric layer 256 may be a high-k dielectric as discussed above. A metal layer 257 is formed on gate dielectric layer 256. The metal layer 257 may be a work function metal layer. In an embodiment, the metal layer 257 has an opposite conductivity type (n-type or p-type) from the metal gate layer 220. In an embodiment, the metal layer 257 is a p-type work function layer. A fill metal layer 258 is formed on the metal layer 257, filling the remaining of the trenches 252 and 254 of FIG. 2D.

Figure 2F:
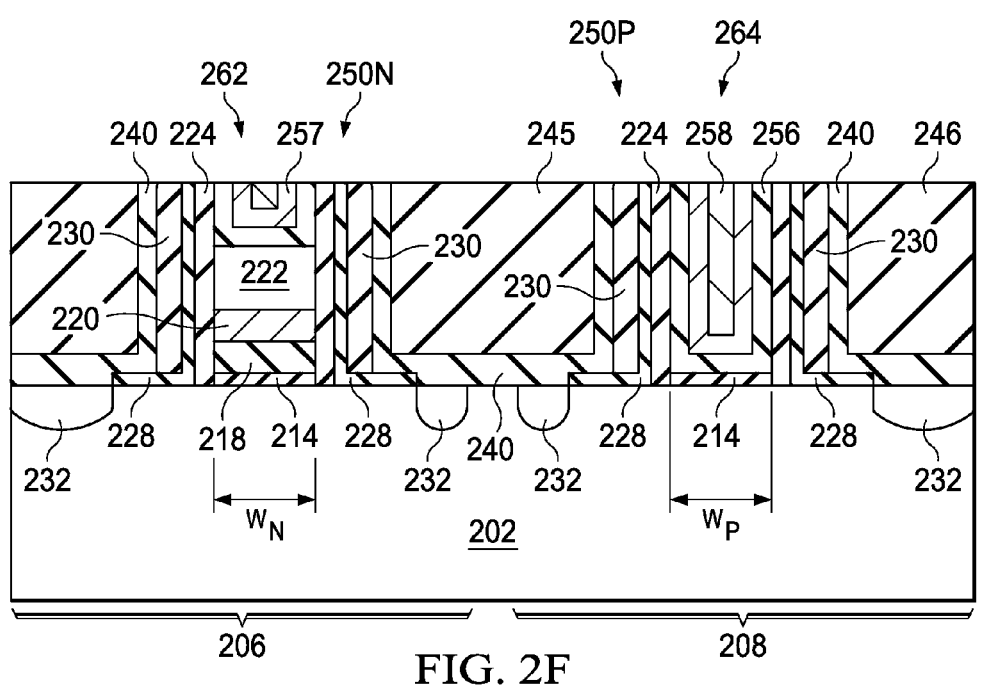

The method 100 then proceeds to block 112 where a planarization process is performed to remove excess materials above the dielectric layer formed between the gate structures. As shown in FIG. 2F, the device of FIG. 2E has been planarized removing excess fill metal layer 258, metal layer 257, and gate dielectric layer 256 from the surface of the dielectric layer 245. In some embodiments, the planarization is achieved by chemical-mechanical polishing (CMP) process(es).

Thus, a gate stack 262 is formed in the first region 206 of the substrate 202, and is part of gate structure $250_N$. The gate stack 262 includes the interfacial layer 214, the dielectric layer 218, the metal layer 220, the polysilicon layer 222, the dielectric layer 256, the metal layer 257, and the fill layer 258. In an embodiment, the metal gate layer 220 provides the work function value for the gate stack 262. In an embodiment, the gate stack 262 provides a gate for a NFET device.

Further, a gate stack 264 is formed in the second region 208 of the substrate 202, and is part of gate structure $250_P$. The gate stack 264 includes the interfacial layer 214, the dielectric layer 256, the metal layer 257, and the fill metal layer 258. In an embodiment, the metal layer 257 provides the work function value for the gate stack 264. In an embodiment, the gate stack 264 provides a gate for a PFET device.

As described above, gate structures $250_N$ and $250_P$ are gate structures for NFET and PFET devices, respectively. The mechanisms of forming gate structures $250_N$ ($250_N$ is a combination of gate first and gate last) and $250_P$ are called replacement-metal-gate (RMG) or gate-last mechanisms. NFETs and PFETs can be used for making digital, analog, and/or mixed-signal (containing both digital and analog) devices. The channel lengths of FETs (field-effect transistors) for analog applications are usually longer than digital applications. The advancement of digital devices focuses on speed, which is improved by shortening the channel length. In contrast, analog devices generally are needed to have high output resistance. To ensure high output resistance, channel lengths of analog devices need to be sufficiently long. For example, for N20 technology node, the channel lengths of digital devices are in a range from about 15 nm to about 30 nm. However, the analog devices on the same die as the digital devices could have channel lengths, for example, in a range from about 100 nm to about 1000 nm depending on output resistance and speed tradeoff. For convenience of explanation and for reference to drawings, the channel length (between source and drain) is called channel width hereafter.

Figure 3A:
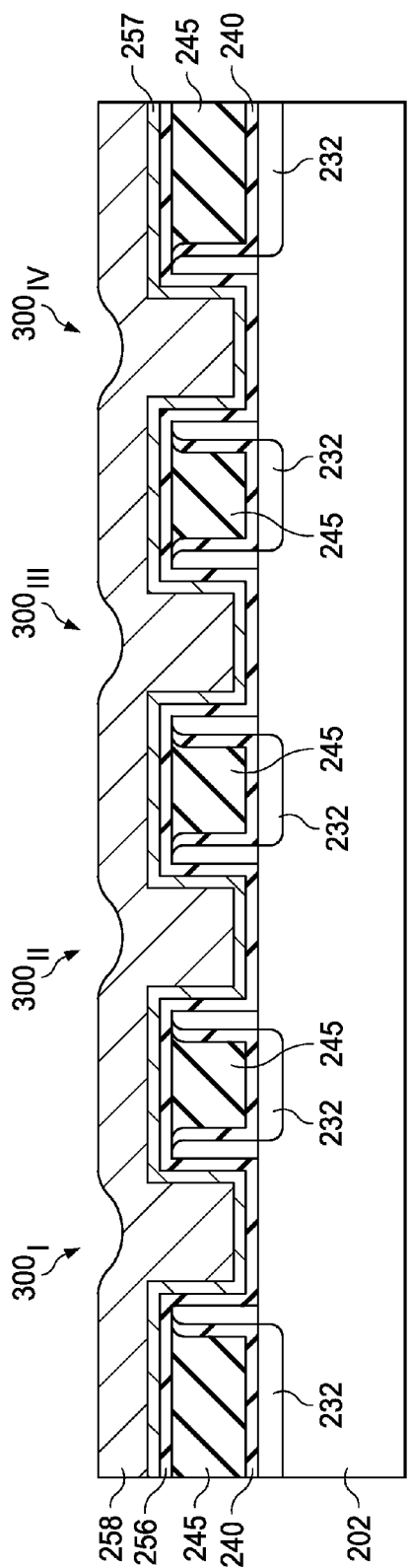
FIG. 3A shows a number of gate structures of analog devices, in accordance with some embodiments.

The channel widths of FETs are roughly the same as the widths of gate stacks. FIG. 2F shows that a width $W_N$ of gate stack 262 and a width $W_P$ of gate stack 264. For analog devices with a number of gate structures next to one another, the long gate widths (or channel widths) could result in dishing of gate structures during chemical-mechanical polishing (CMP) processes. FIG. 3A shows a number of gate structures, $300_I$, $300_{II}$, $300_{III}$, and $300_{IV}$, for PFETs of analog devices, in accordance with some embodiments. Gate structures, $300_I$, $300_{II}$, $300_{III}$, and $300_{IV}$, have identical gate width $W_{P4}$, as shown in FIG. 3A. In some embodiments, $W_{P4}$ is in a range from about 100 nm to about 1000 nm. In some embodiments, Gate structures, $300_I$, $300_{II}$, $300_{III}$, and $300_{IV}$, have different gate widths.

Gate structures, $300_I$, $300_{II}$, $300_{III}$, and $300_{IV}$, include the interfacial layer 214, the dielectric layer 256, the metal layer 257, and the fill metal layer 258. As mentioned above, the fill metal layer 258 may be referred to as a gate layer and may include Al, W, or Cu and/or other suitable materials and may be formed by CVD, PVD, plating, and/or other suitable processes. In the example here, the fill metal layer 258 is formed by a plating process, which results in the deposition profile as shown in FIG. 3A in accordance with some embodiments. One or more CMP processes are used to remove the dielectric layer 256, metal layer 257 and fill metal layer 258 above dielectric layer 245. In some embodiments, a metal CMP process may be used to remove the fill metal layer 258 and metal layer 257 and a dielectric CMP process may be used to remove dielectric layer 256. In some other embodiments, a single CMP process is used to remove the above mentioned layers. Other combination of CMP processes may also be used.

Figure 3B:
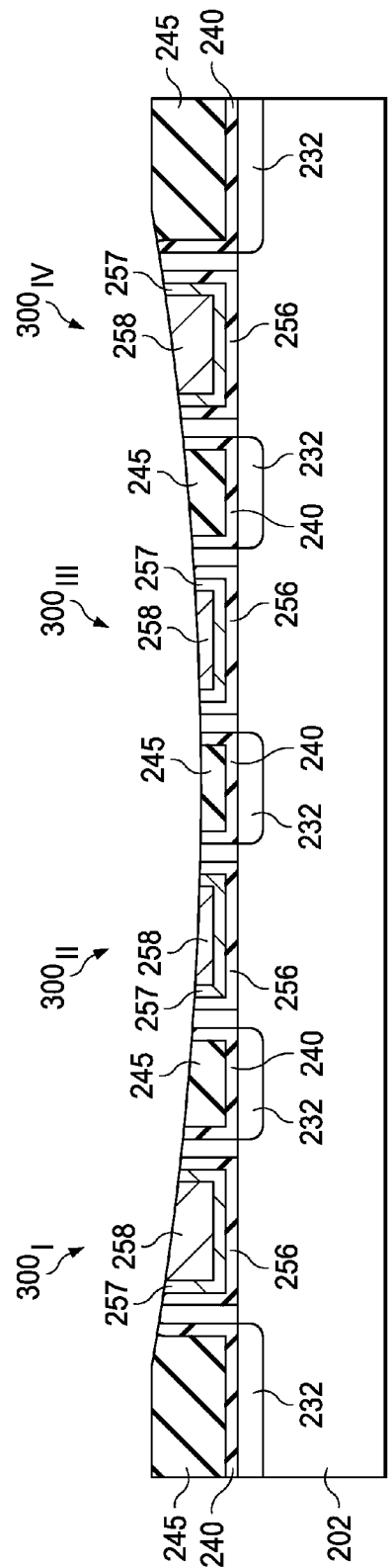
FIG. 3B shows that gate structures of FIG. 5A suffering from dishing effect after planarization, in accordance with some embodiments.

Since CMP processing involves using polishing pads, which could bend and result in dishing of large metal areas. Due to large gate widths of analog device and a number of them being placed next to one another, severe dishing can occur to result in significant loss of fill metal layer 258 and metal layer 257. FIG. 3B shows that gate structures, $300_I$, $300_{II}$, $300_{III}$, and $300_{IV}$, suffering from dishing effect after planarization, in accordance with some embodiments. Each of gate structures, $300_I$, $300_{II}$, $300_{III}$, and $300_{IV}$, experiences unwanted loss of fill metal layer 258 and metal layer 257, which would increase the gate resistance of gate stack 264 and change its work function. Gate structures $300_I$ and $300_{IV}$ are near the edges of the series of gate structures, $300_I$, $300_{II}$, $300_{III}$, and $300_{IV}$, and suffered from less loss of fill metal layer 258 and metal layer 257 compared to gate structures $300_{II}$ and $300_{III}$. Such varying degree of loss of gate stacks 264 makes gate resistance and work function of gate stacks 264 unpredictable. Such variation is extremely detrimental for circuits that require matching, e.g. $300_I$, $300_{II}$, $300_{III}$, and $300_{IV}$ to be the same in this example. Similar problems also exist for NFETs of analog devices. Therefore, there is a need for mechanisms to reduce dishing of gate stacks and gate structures during CMP of gate stack layers described above. The gate structures in FIGS. 3A and 3B are simplified. Some elements described and shown in other drawings are not shown in these two drawings.

Figure 4A:
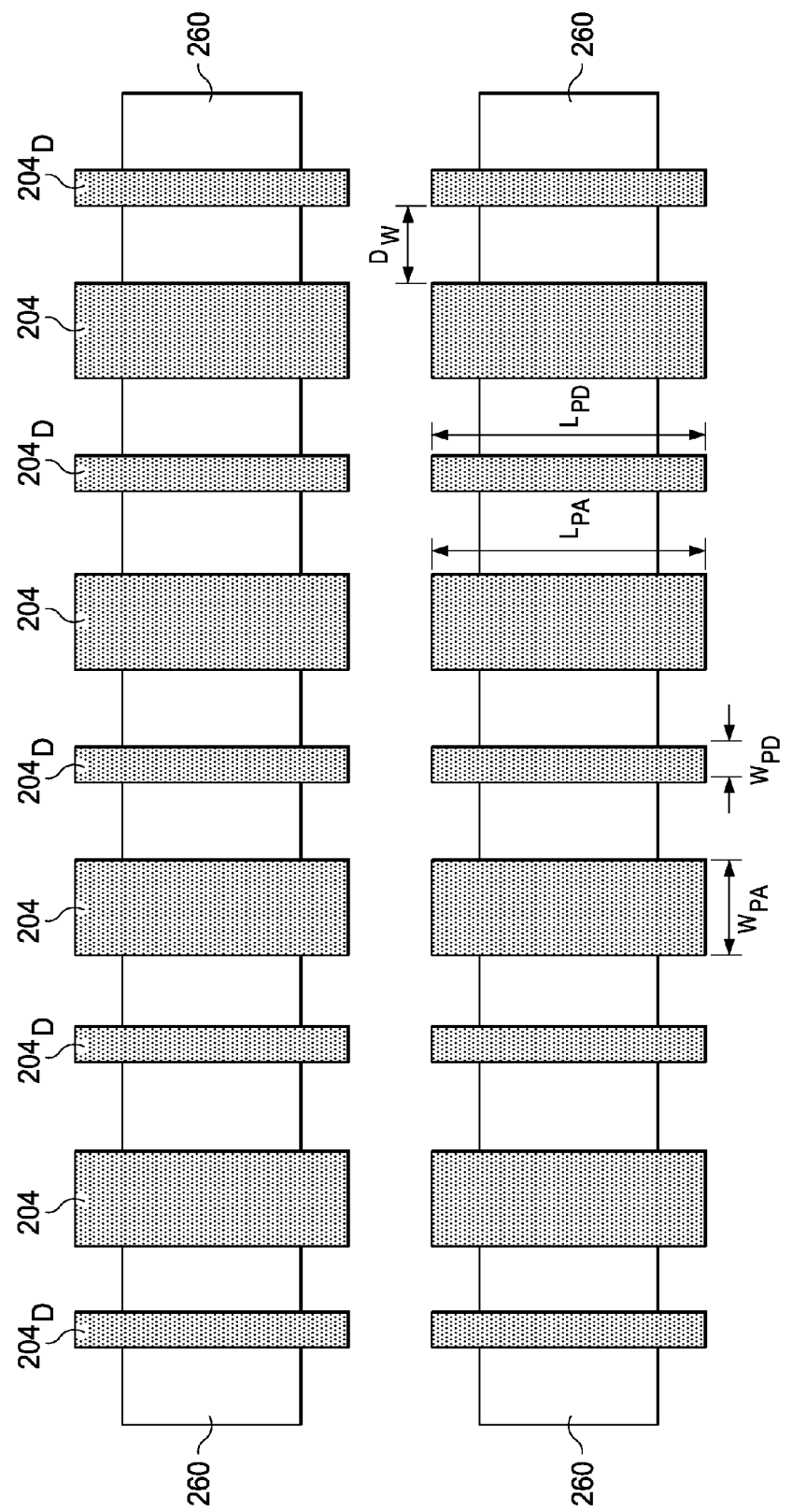
Figure 4B:
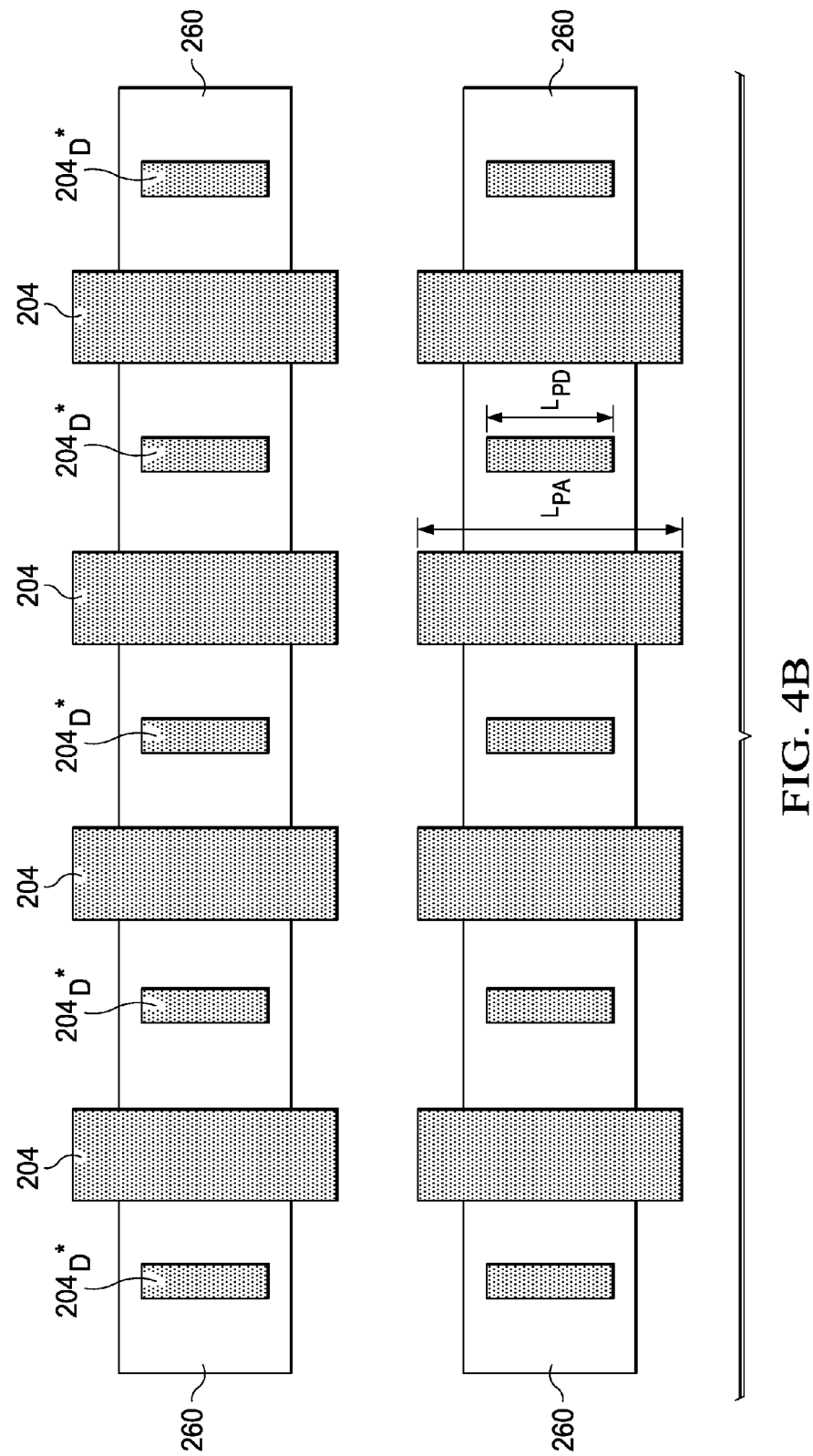

FIG. 4A shows a top view of gate stacks 204 and dummy gate stacks 204, in accordance with some embodiments. The gate stacks 204 are for forming logic devices and each has a width $W_{PA}$ and a length $L_{PA}$. Part of the gate stacks 204 and dummy metal stacks 204D are formed over diffusion regions (or source and drain regions) 260. A dummy gate stack $204_D$ is inserted between two gate stacks 204. The dummy gate stacks $204_D$ are used to form dummy devices, which are tied to ground or supply and not expected to function. Each dummy gate stack $204_D$ has a width $W_{PA}$ and a length $L_{PD}$. $W_{PA}$ is larger than $W_{PD}$. In FIG. 4A, $L_{PA}$ is equal to $L_{PD}$. However, $L_{PD}$ could be shorter to $L_{PA}$. FIG. 4B shows that $L_{PD}'$ is shorter than $L_{PA}$, in accordance with some embodiments. Alternatively, $L_{PD}$ of dummy gate structures $204_D*$ can be longer than $L_{PA}$ of gate structures 204. In some embodiments, $W_{PA}$ is in a range from about 100 nm to about 1000 nm. In some embodiments, dummy gate stack $204_D$ has width of a logic device. In some embodiments, dummy gate stack $204_D$ has a width between a logic device and an analog device. In some embodiments, $W_{PD}$ is in a range from about 10 nm to about 100 nm. In some embodiments, the ratio of $W_{PA}$ to $W_{PD}$ is in a range from about 5 to about 100.

The distance between a gate stack 204 and a neighboring dummy gate stack $204_D$ is $D_W$. $D_W$ is determined by design rule, in accordance with some embodiments. In some embodiments, $D_W$ is in a range from about 40 nm to about 200 nm.

With the insertion of dummy gate stacks $204_d$, the metal gate density of eventual gate stacks 264 is reduced. As a result, the CMP dishing effect is reduced. The metal layers in the metal gate density refer to the filler metal layer 258 and metal layer 257. The metal gate density is about equal to the total surface areas of gate stacks to the total surface area. CMP dishing effect decreases with the decrease in metal gate density. In some embodiments, the metal gate density is designed to be in a range from about 20% to about 60% to reduce CMP dishing. In some embodiments, the metal gate density is designed to be in a range from about 20% to about 40% to reduce CMP dishing.

More than one, such as 2, 3, or more, dummy gate stacks $204_D$ may be inserted between two neighboring gate stacks 204. FIG. 4C shows two dummy gate stacks $204_D$ are inserted between two neighboring gate stacks 204, in accordance with some embodiments. In FIG. 4C, the distance between two dummy gate stacks $204_D$ is $D_{DW}$, which is smaller than $D_W$. In some embodiments, $D_{DW}$ is in a range from about 40 nm to about 200 nm. In some embodiments, the distance $D_{DW}$ is equal to $D_W$.

The insertion of dummy gate structures could also vary with the location of the analog devices. As shown in FIG. 3B, the edge devices, such as $300_I$ and $300_{IV}$, suffer from dishing effect differently from center devices, $300_{II}$ and $300_{III}$. The number of dummy gate devices could be fewer outside edge gate stacks than between gate stacks. FIG. 4D shows a number of gate stacks and dummy gate stacks, in accordance with some embodiments. There are two dummies gate stacks $204_D$ between gate stacks 204 and 204' (at edge). However, outside of edge gate stack 204', there is only one dummy gate stack $204_D$. The number of dummy gate stacks does not need to be the same between gate stacks.

Figure 4E:
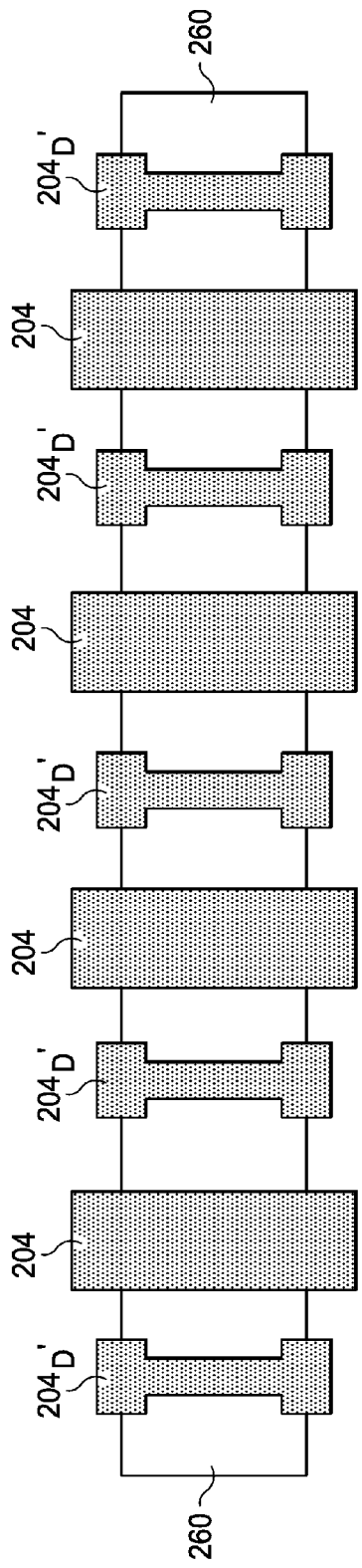

The dummy gate stacks $204_D$ described above are shaped in columnar bars, with a rectangular cross section. However, dummy gate stacks $204_D$ could also be in other shapes. For example, the ends of the dummy gate stacks $204_D$ could be wider than the center portions. FIG. 4E shows a number of gate stacks and dummy gate stacks, in accordance with some embodiments. The dummy gate stacks $204_D'$ have ends wider than the center portion. The shape, rectangle, of ends of dummy gate stacks $204_D'$ in FIG. 4E is merely an example. Other shapes, such as pentagon, hexagon, etc., are also possible.

Figure 5:
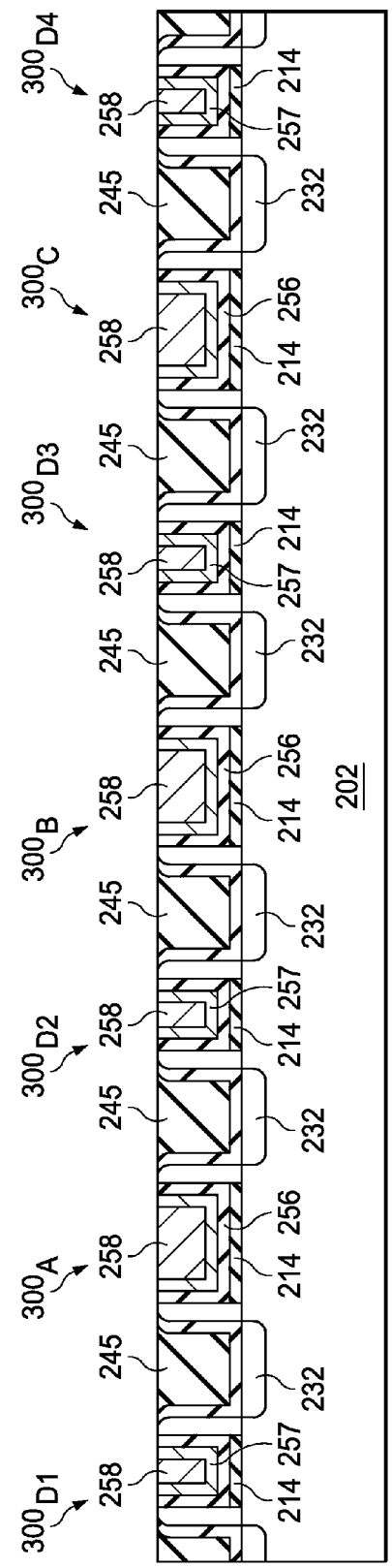
FIG. 5 shows a cross-sectional view of gate structures with inserted dummy gate structures after planarization by chemical-mechanical polishing (CMP), in accordance with some embodiments.

FIG. 5 shows a cross-sectional view of gate structures with inserted dummy gate structures after planarization by CMP, in accordance with some embodiments. FIG. 5 shows gate structures, $300_A$, $300_B$, and $300_C$, with dummy gate structures, $300_{D1}$, $300_{D2}$, $300_{D3}$, and $300_{D4}$, between them and next to the edge gate structures. The CMP process(es) removed the materials above dielectric layer 245. FIG. 5 shows that dishing issue is resolved due to the insertion of dummy gate structures. The gate structures in FIG. 5 are simplified. Some elements previously shown and described are not shown in FIG. 5.

PFETs are used as examples above to illustrate issues of dishing and mechanisms to solve the issue. As mentioned above, NFETs may also suffer from similar dishing issue for wide gate devices. Therefore, embodiments of dummy gate structures described above may also be used for NFETs. The issue of dishing becomes more pronounced for a number of wide gate structures. Any types of wide gate structures, not limited to analog devices, may benefit from using the dummy gate structures described.

The described embodiments of mechanisms for placing dummy gate structures next to and/or near a number of wide gate structures reduce dishing effect for gate structures during chemical-mechanical polishing of gate layers. The arrangements of dummy gate structures and the ranges of metal pattern density have been described. Wide gate structures, such as analog devices, can greatly benefit from the reduction of dishing effect.

The embodiments disclosed herein provide for a method and device having a hydrid (or differing) configuration of gate structures on a substrate. In an embodiment, a gate-first process is used to define one type of transistor (e.g., NFET) and a gate-last or replacement gate type methodology is used to define another type of transistor (e.g., PFET). In a further embodiment, a dummy gate (or non-functional gate) is provided following the gate-last or replacement gate type methodology used to define the second transistor type. Thus, in an embodiment, a PFET dummy device is provided on the substrate. In doing so, the present disclosure offers embodiments which may provide advantages over prior art devices. For example, a gate height variation across the substrate and/or regions of the substrate, CMP induced over-polish, CMP induced under-polish (for example as seen in traditional replacement gate methodologies) may be improved using embodiments described. It is understood that different embodiments disclosed herein offer different disclosure, and that they may make various changes, substitutions and alterations herein without departing from the spirit and scope of the present disclosure.

In some embodiments, a device is provided. The device includes a plurality of analog gate structures, and the analog gate structures are formed by replacement gate methodology. The device also includes a plurality of dummy gate structures disposed between the plurality of analog gate structures and adjacent to one or more of the plurality of analog gate structures at the edges of the plurality of gate structures. A first surface of the plurality of analog gate structure is coplanar with a second surface of the plurality of dummy gate structures.

In some other embodiments, a device is provided. The device includes a plurality of gate structures, and the gate structures are formed by replacement gate methodology. One of the gate structures has a first width in a range from about 10 nm to about 1000 nm. The device also includes a plurality of dummy gate structures disposed between the plurality of gate structures and adjacent to one or more of the plurality of gate structures at the edges of the plurality of gate structures. One of the dummy gate structures has a second width smaller than the first width.

In yet some other embodiments, a device is provided. The device includes a plurality of gate structures, and a plurality of dummy gate structures disposed between the plurality of gate structures and adjacent to one or more of the plurality of gate structures at the edges of the plurality of gate structures. A ratio of a width of a gate structure of the plurality of gate structures to a width of a dummy structure of the plurality of dummy gate structures is in range from about 5 to about 100.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
a plurality of analog device gate structures over an active area, wherein the analog device gate structures include respective metal gate layers; and
a plurality of dummy gate structures, wherein a first dummy gate structure of the plurality of dummy gate structures is interjacent two neighboring analog device gate structures, wherein a first surface of the plurality of analog device gate structure is coplanar with a second surface of the plurality of dummy gate structures, wherein the two neighboring analog device gate structures overlap an isolation region, and wherein the first dummy gate structure is completely within the active area in a plan view.

2. The device of claim 1, wherein each of the plurality of analog device gate structures has a width in a range from about 10 nm to about 1000 nm.

3. The device of claim 1, wherein each of the dummy gate structures has a width in a range from about 10 nm to about 100 nm.

4. The device of claim 1, wherein a distance between one of the two neighboring analog device gate structures and the first dummy gate structure is in a range from about 40 nm to about 200 nm.

5. The device of claim 1, wherein the first surface is coplanar with a surface of a dielectric layer between the plurality of analog device gate structures and the plurality of dummy gate structures.

6. The device of claim 1, wherein each of the plurality of analog device gate structures include a gate dielectric layer, a work function layer, and a metal gate layer.

7. The device of claim 6, wherein each of the plurality of analog device gate structures further includes an interfacial layer.

8. The device of claim 6, wherein the metal gate layer is made of a material selected from the group consisting of W, Al, and Cu.

9. The device of claim 1, wherein each of the plurality of analog device gate structures further include a metal gate layer, wherein the metal gate layer includes polysilicon.

10. The device of claim 1, wherein there is only one dummy gate structure is interjacent the neighboring analog device gate structures.

11. The device of claim 1, wherein there are two or more dummy gate structures interjacent the neighboring analog device gate structures.

12. The device of claim 1, wherein a width of one of the plurality of dummy gate structures is smaller than a width of one of the plurality of analog device gate structures.

13. The device of claim 1, wherein ends of a dummy gate structure of the plurality of dummy gate structures are shaped differently from a remaining portion of the dummy gate structure.

14. The device of claim 1, wherein a metal gate density of the plurality of analog device gate structures and the plurality of dummy gate structures is in a range from about 20% to about 40%.

15. The device of claim 1, wherein the plurality of dummy gate structures are grounded if the plurality of analog device gate structures are N-type field-effect transistors (NFETs), and wherein the plurality of dummy gate structures are tied to source power if the plurality of analog device gate structures are P-type field-effect transistors (PFETs).

16. The device of claim 1, wherein a ratio of a width of an analog device gate structure of the plurality of analog device gate structures to a width of a dummy structure of the plurality of dummy gate structures is in range from about 5 to about 100.

17. A device, comprising:
a plurality of gate structures overlying an active region, each of the plurality of gate structures including a u-shaped gate dielectric layer, a u-shaped work function metal layer nested within the u-shaped gate dielectric layer, and a metal fill layer nested within the u-shaped metal work function layer, and where neighboring gate structures of the plurality of gate structures are separated by a first distance, the plurality of gate structures comprising a first gate structure and a second gate structure; and
a plurality of dummy gate structures overlying the active region, wherein at least one dummy gate structure is disposed between neighboring gate structures, the plurality of dummy gate structures comprising a first dummy gate structure and a second dummy gate structure, the first dummy gate structure and the second dummy gate structure having a length less than a length of the first gate structure and the second gate structure, the first dummy gate structure and second dummy gate structure being interposed between the first gate structure and the second gate structure such that no other gate structure is interposed between the first gate structure and the second gate structure other than the first dummy gate structure and second dummy gate structure, and wherein the first dummy gate structure is interposed between the first gate structure and the second dummy gate structure.

18. The device of claim 17, wherein the first dummy gate structure has end regions and an intermediate region interposed between the end regions, the end regions having a first width greater than a second width of the intermediate region, the end regions overlapping a boundary of the active region.

19. A device, comprising:
a plurality of active gate structures overlying an active region, each of the plurality of active gate structures including a u-shaped gate dielectric layer, a u-shaped work function metal layer nested within the u-shaped gate dielectric layer, and a metal fill layer nested within the u-shaped metal work function layer, the plurality of active gate structures comprising a first active gate structure and a second active gate structure, the first active gate structure and the second active gate structure being adjacent active gate structures of the plurality of active gate structures; and
a plurality of dummy gate structures including at least one dummy gate structure disposed between consecutive ones of the plurality of active gate structures and adjacent to one or more of the plurality of active gate structures at edges of the plurality of active gate structures, the plurality of dummy gate structures comprising a first dummy gate structure interposed between the first active gate structure and the second active gate structure, the first dummy gate structure having a length less than a length of the first active gate structure and the second active gate structure, the first dummy gate structure having end regions and an intermediate region interposed between the end regions, the end regions having a first width greater than a second width of the intermediate region, the end regions overlapping a boundary of the active region.

20. The device of claim 19, wherein the plurality of dummy gate structures comprises a second dummy gate structure interposed between the first active gate structure and the second active gate structure.

* * * * *